US010654216B2

(12) United States Patent
Lu et al.

(10) Patent No.: US 10,654,216 B2
(45) Date of Patent: May 19, 2020

(54) SYSTEM AND METHODS FOR NANOIMPRINT LITHOGRAPHY

(71) Applicant: CANON KABUSHIKI KAISHA, Tokyo (JP)

(72) Inventors: Xiaoming Lu, Cedar Park, TX (US); Philip D. Schumaker, Austin, TX (US); Byung-Jin Choi, Austin, TX (US)

(73) Assignee: Canon Kabushiki Kaisha (JP)

( * ) Notice: Subject to any disclaimer, the term of this patent is extended or adjusted under 35 U.S.C. 154(b) by 194 days.

(21) Appl. No.: 15/084,947

(22) Filed: Mar. 30, 2016

(65) Prior Publication Data

US 2017/0282439 A1 Oct. 5, 2017

(51) Int. Cl.
| | |
|---|---|
| *B29C 59/00* | (2006.01) |
| *G03F 7/00* | (2006.01) |
| *G03F 7/20* | (2006.01) |
| *B29C 59/02* | (2006.01) |
| *H01L 21/687* | (2006.01) |
| *B29L 31/00* | (2006.01) |

(52) U.S. Cl.
CPC .......... *B29C 59/002* (2013.01); *G03F 7/0002* (2013.01); *G03F 7/707* (2013.01); *G03F 7/70691* (2013.01); *B29C 59/022* (2013.01); *B29L 2031/00* (2013.01); *G03F 7/0027* (2013.01); *H01L 21/687* (2013.01)

(58) Field of Classification Search
CPC ... B29C 59/002; B29C 59/022; B29C 59/023; G03F 7/707; G03F 7/0027; G03F 7/0002; G03F 7/70691; H01L 21/687

USPC .......................................................... 425/385
See application file for complete search history.

(56) References Cited

U.S. PATENT DOCUMENTS

| | | | | |
|---|---|---|---|---|
| 4,737,824 | A * | 4/1988 | Sakai | G03F 7/707 355/53 |
| 5,128,975 | A * | 7/1992 | Iwamoto | G03F 7/707 250/491.1 |
| 6,408,879 | B1 * | 6/2002 | Ohmi | F16K 27/003 137/606 |
| 6,590,633 | B1 * | 7/2003 | Nishi | G03F 7/70358 269/21 |
| 6,873,087 | B1 | 3/2005 | Choi et al. | |
| 6,932,934 | B2 | 8/2005 | Choi et al. | |
| 6,936,194 | B2 | 8/2005 | Watts | |
| 7,077,992 | B2 | 7/2006 | Sreenivasan et al. | |
| 7,157,036 | B2 | 1/2007 | Choi et al. | |
| 7,179,396 | B2 | 2/2007 | Sreenivasan | |
| 7,396,475 | B2 | 7/2008 | Sreenivasan | |
| 7,635,263 | B2 | 12/2009 | Cherala et al. | |
| 8,066,930 | B2 | 11/2011 | Sreenivasan et al. | |

(Continued)

*Primary Examiner* — Robert C Dye
*Assistant Examiner* — Sonny V Nguyen
(74) *Attorney, Agent, or Firm* — Cameron A. King

(57) ABSTRACT

An imprint lithography system that pressurizes and depressurizes an air cavity behind a retained imprint template or substrate so as to deflect the template or substrate to aid in filling the template pattern with fluid resist and/or separating the template from the cured resist on the substrate. The system includes a controller, pressure sensors, and an impedance valve for modulating the air cavity pressure so as to reduce pressure wave oscillations within the cavity that otherwise negatively impact overlay accuracy control, fluid spread control and separation control.

8 Claims, 7 Drawing Sheets

(56) References Cited

U.S. PATENT DOCUMENTS

| | | |
|---|---|---|
| 8,076,386 B2 | 12/2011 | Xu et al. |
| 8,349,241 B2 | 1/2013 | Sreenivasan et al. |
| 8,556,616 B2 | 10/2013 | Resnick et al. |
| 2001/0016302 A1* | 8/2001 | Hirayanagi ............ G03F 7/707 430/322 |
| 2006/0197036 A1* | 9/2006 | Severijns ............... G03F 7/707 250/492.1 |
| 2010/0320645 A1* | 12/2010 | Ganapathisubramanian ............... B82Y 10/00 264/293 |
| 2017/0277039 A1* | 9/2017 | Kawahara ............ G03F 7/7085 |

* cited by examiner

SYSTEM AND METHODS FOR NANOIMPRINT LITHOGRAPHY

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, resist removal, dicing, bonding, and packaging, and the like.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Those of skill in the art will appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

Figure 1:
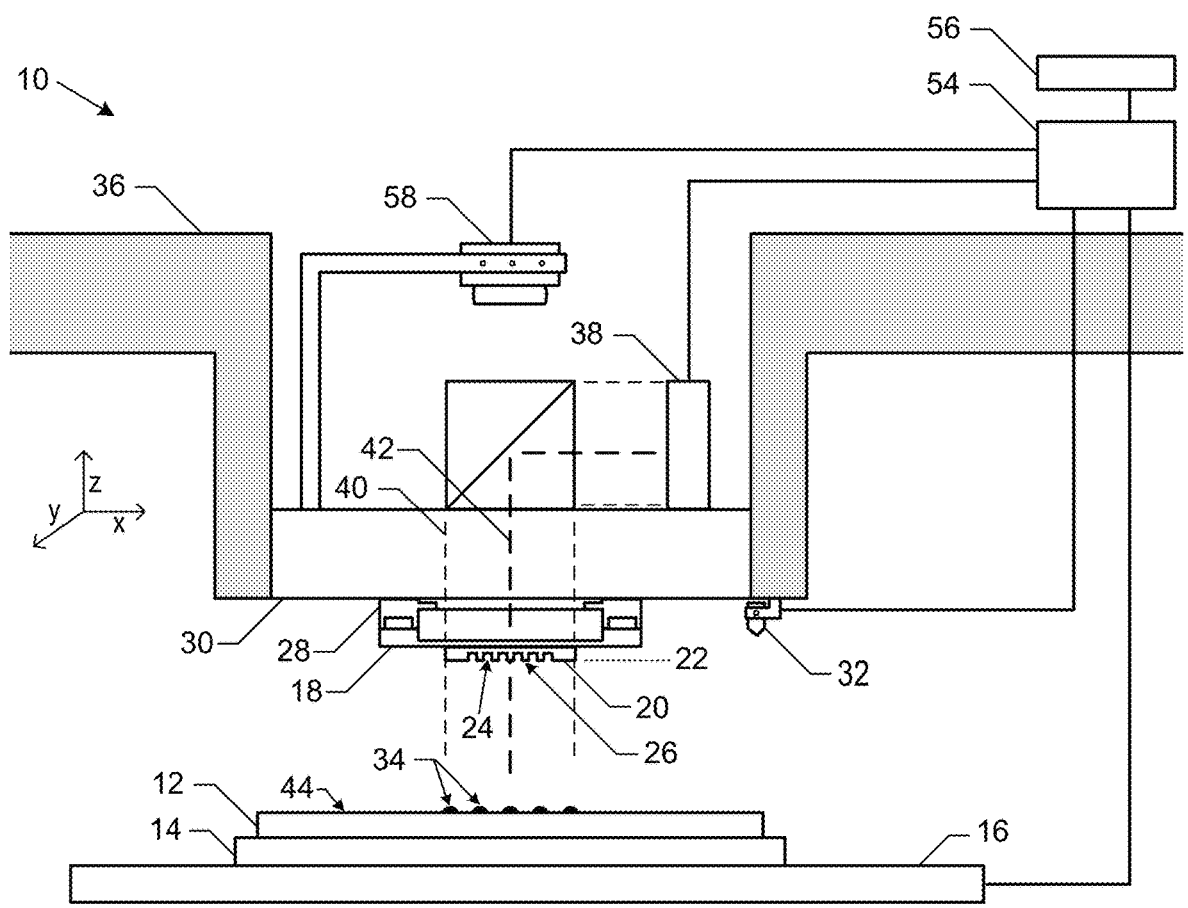
FIG. 1 illustrates a simplified side view of a nanoimprint lithography system having a template and a mold spaced apart from a substrate.

Referring to the figures, and particularly to FIG. 1, illustrated therein is nanoimprint lithography system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 may include a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28 as detailed further herein. Chuck 28 may be configured as, but not limited to, vacuum, pin-type, groove-type, electrostatic, electromagnetic, and/or other similar chuck types. Exemplary chucks are described in U.S. Pat. No. 6,873,087. Further, chuck 28 may be coupled to imprint head 30 which in turn may be moveably coupled to bridge 36 such that chuck 28, imprint head 30 and template 18 are moveable in at least the z-axis direction.

Nanoimprint lithography system 10 may further comprise a fluid dispense system 32. Fluid dispense system 32 may be used to deposit formable material 34 (e.g., polymerizable material) on substrate 12. Formable material 34 may be positioned upon substrate 12 using techniques such as drop-dispense, spin-coating, dip-coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. Nos. 7,157,036 and 8,076,386, both of which are herein incorporated by reference.

Figure 2:
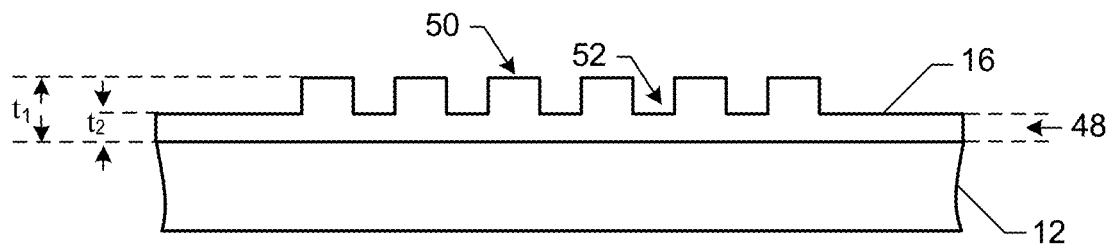
FIG. 2 illustrates a simplified view of the substrate illustrated in FIG. 1, having a solidified patterned layer formed thereon.

Referring to FIGS. 1 and 2, nanoimprint lithography system 10 may further comprise energy source 38 that directs energy 40 along path 42. Imprint head 30 and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head 30, fluid dispense system 32, energy source 38, and/or camera 58, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, energy source 38 produces energy 40, e.g., ultraviolet radiation, causing formable material 34 to solidify and/or cross-link, conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

Figure 3:
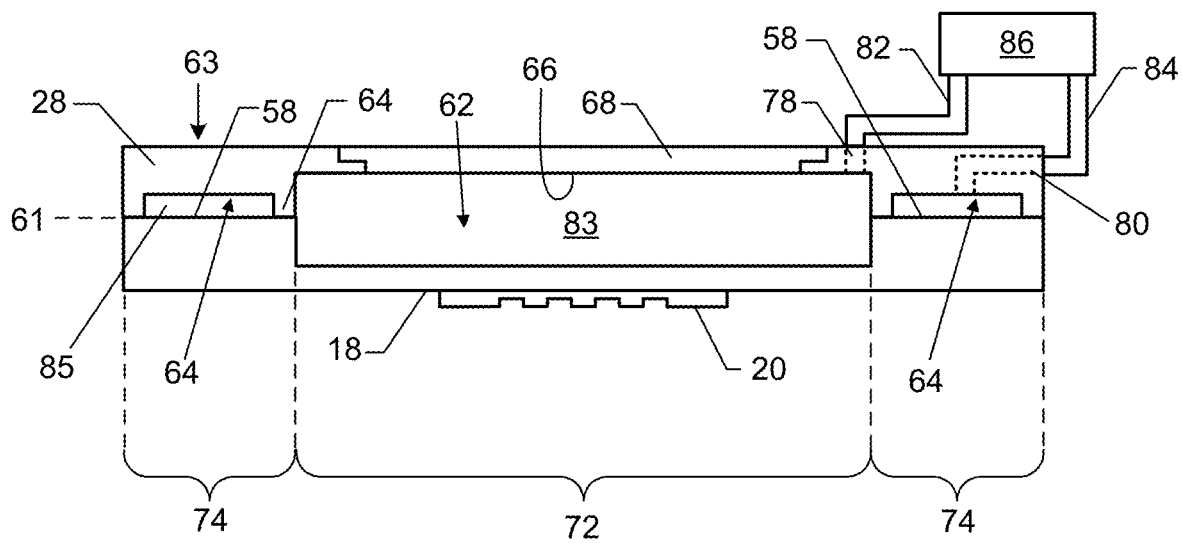
FIG. 3 illustrates a cross-sectional view of a portion of a template and template chuck assembly including an air cavity that can be pressurized to impart shape modulation to the template.

Referring further to FIGS. 1 and 3, template 18 is coupled to the template chuck 28. The template chuck 28 includes opposed sides 61 and 63, with first side 61 including interior recess 62 defined by inner support region 64, and outer recess 66 and defined by inner support region 64 and outer support region 68. That is, outer support region 68 cinctures outer recess 66, inner support region 64 and inner recess 62, and inner support region 62 cinctures inner recess 62. In a particular embodiment, the outer support region 68 has a square shape, and the inner support region 64 has a circular shape; however, in other embodiments, the support regions 62 and 68 can include any geometric shape desired. A portion 68 of template chuck 28 is in superimposition with the inner recess 62 and can be transparent to radiation having a predetermined wavelength or a range of wavelengths. The portion 68 can include a thin layer of transparent material, such as glass. However, the material of the portion 68 may depend upon the wavelength of radiation emitted by the energy source. The portion 68 extends from side 63 and terminates proximate to the recess 62, with portion 68 having an area at least as large as an area of mold 20 of retained template 28 so that mold 20 is in superimposition with portion 68.

The template chuck 28 includes throughways 78 and 80. In an alternative embodiment, the template chuck 28 may have a different number of throughways. The throughway 78 places the recess 62 in fluid communication with the surface 63, however, in other embodiments, the throughway 78 places the recess 62 in fluid communication with any surface of template chuck 28. The throughway 80 places the recess 64 in fluid communication with the side 63, however, in other embodiments, the throughway 80 places the recess 64 in fluid communication with any surface of template chuck 28. The throughways 78 and 80 can facilitate placing the recesses 62 and 64, respectively, in fluid communication with a pressure control system, such as a pump system 86.

Figure 4A:
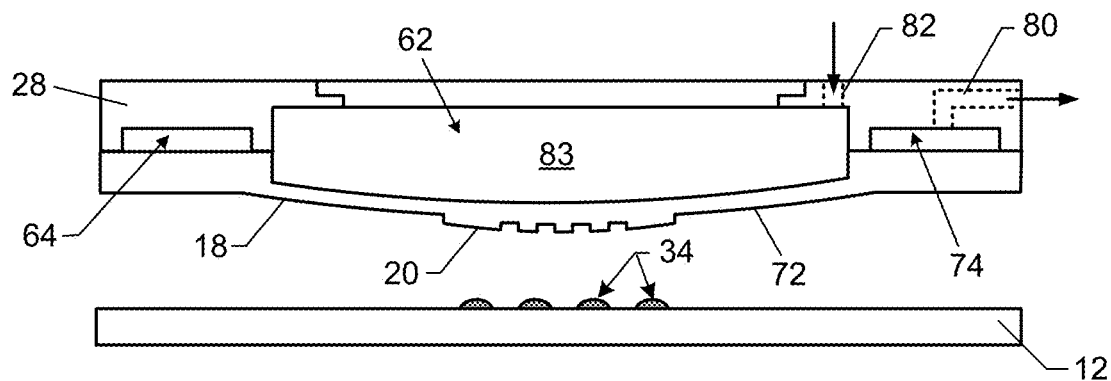
FIG. 4A-4D illustrates a portion of a nanoimprint process employing template shape modulation.
Figure 4B:
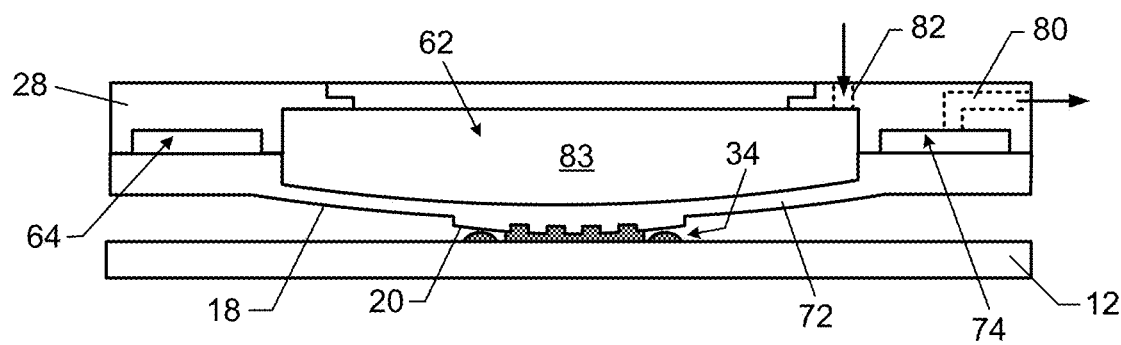
Figure 4C:
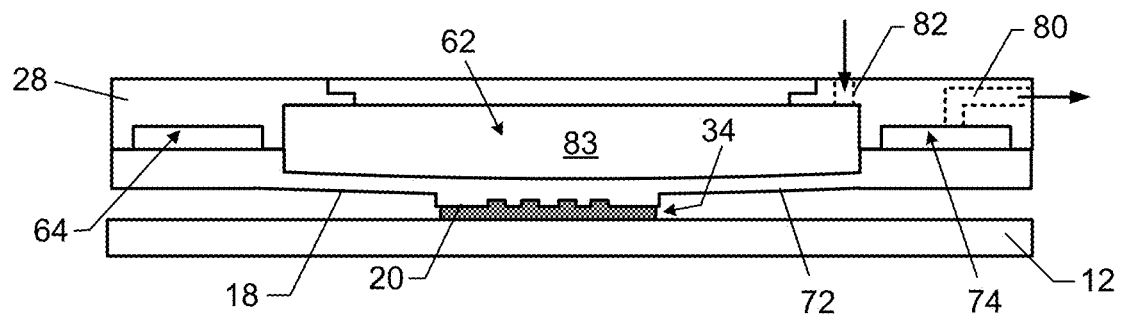
Figure 4D:
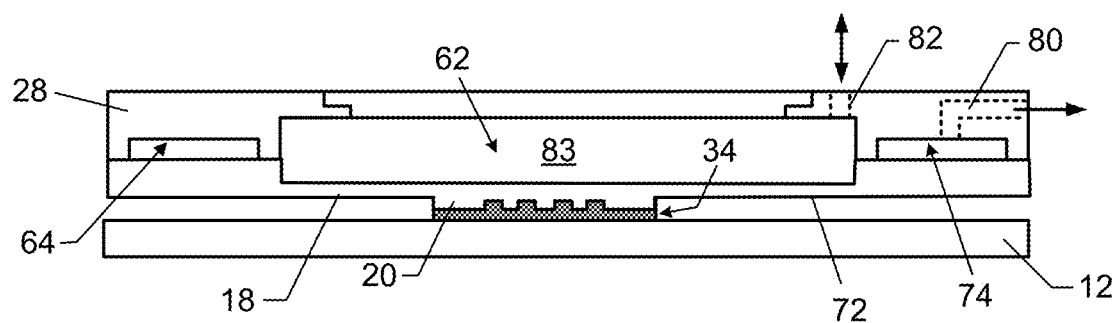

The pump system 86 may include one or more pumps to control the pressure proximate to the recesses 62 and 64. To that end, when the template 18 is coupled to the template chuck 28, the template 18 rests against the support regions 64 and 68, covering the recesses 62 and 64. A flexible region 72 of the template 18 may be in superimposition with the recess 62, defining an inner chamber or cavity 83 and a thicker region 74 of the template 18 may be in superimposition with recess 64, defining an outer chamber or cavity 85. The pump system 86 operates to control a pressure in the chambers or cavities 83 and 85. Chamber or cavity 85 can be held or maintained at suitable vacuum pressures to retain template 18 against template chuck 28, while chamber or cavity 83 can be subjected to positive pressure and/or negative pressure so as to impart desired shape modulation to the flexible region of the template 18. Such shape modulation provides important advantages to nanoimprint lithography processes, including (a) improving the speed within which polymerizable material fills the pattern features of the template while also minimizing fill-related defects and (b) improving separation quality (i.e., separating the template from the polymerized material with reduced separation-related defects). With particular reference to FIG. 4A-D, an example of such shape modulation is shown. In FIG. 4A, cavity 83 is pressurized to bow or flex the flexible region 72 and mold 20 of template 18 toward substrate 12 and the deposited formable material 34. In FIG. 4B, the patterned surface of mold 20 has contacted formable material 34 and the material has begun filling the patterned surface of mold 20 in a center-to-perimeter direction. By FIG. 4C, the patterned surface fill is almost complete, if not full complete, and the pressure in cavity 83 being reduced such that the flexible region 72 is approaching a parallel condition, if not fully parallel, with the substrate. Any necessary overlay alignment adjustments are also being completed at this stage. By FIG. 4D, the patterned surface has been completely filled, overlay adjustments have been made, and formable material 34 has been solidified to form the patterned layer on substrate 12. The template 18 is then separated from the formed pattern layer (not shown) by processes that can likewise include modulating the template shape, e.g., by pressurizing and/or applying vacuum to the cavity 83.

Figure 5:
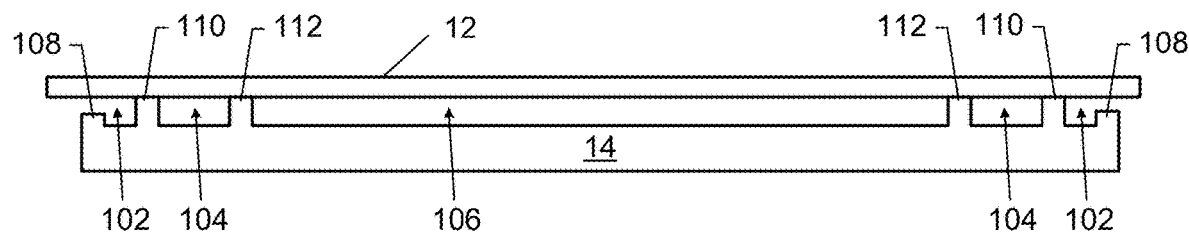
FIG. 5 illustrates a cross-sectional view of a portion of a substrate and substrate chuck assembly including a plurality of air cavities that can be pressurized to impart shape modulation to the substrate.

Substrate chucks can likewise be configured to provide for shape modulation of retained substrates. This can be advantageous for, among other things, separation of the template from the formed patterned layer. Turning to FIG. 5, wafer chuck 14 is shown retaining substrate 12 in a chucked condition. Wafer chuck 14 includes an outer zone 202, an intermediate zone 204, and a central zone 206, where the intermediate zone 204 is disposed between the outer zone 202 and the central zone 206. Each of the zones 202, 204, and 206 is defined in part by a recessed land 208 and full-height lands 210 and 212. In an embodiment, each of the lands 208, 210, and 212 are continuous, and thus, the lands 208, 210, and 212 are concentric. The outer zone 202 is laterally defined by the lands 208 and 210, the intermediate zone 204 is laterally defined by the lands 210 and 212, and the central zone 206 is laterally defined by the land 212. In another embodiment, the recessed land 208 can be replaced by a full-height land. A pressure control system (not shown) can be connected to zones 208, 210 and 212 to independently apply positive pressure and/or negative pressure to each zone, such that each zone can be considered to be an air cavity similar to air cavity 83 of template 28. Different pressures can be advantageously applied to the different zones during the imprinting, curing, and separation processes.

Important considerations and requirements in nanoimprint lithography include high overlay accuracy between the imprint layer being formed and a previously formed patterned layer within the substrate. For certain nanoimprint lithography applications, overlay accuracy of 6 nm or less is required while maintaining high throughput (e.g., 1 second or less total time budget in step-and-repeat processes with 22×33 mm imprinted field size per step). With respect to a template chuck and template system as described above, the pressure and/or vacuum applied to inner cavity 83 needs to be tightly controlled to achieve these objectives. However, under high throughput conditions conventional pneumatic systems can produce pressure instability, including pressure wave oscillations, which can adversely affect overlay accuracy as well as separation. More specifically, while such systems can be effective in adjusting pressure to the inner cavity 83, and thereby effect the desired shape modulation of template 18, in doing so pressure wave oscillations are created within cavity 83 as the pressure system operates to increase or decrease pressure within the cavity. These pressure wave oscillations in turn can produce undesired movement of the template 18 at the nanometer scale, including lateral movement (i.e., movement in the x-y plane). Such nanometer scale lateral movement during the fluid fill and alignment step interferes with and disrupts overlay accuracy, leading to overlay defects. Further, such nanometer scale lateral movement during separation can impart undesirable shear stress on the formed pattern features of the formed patterned, leading to separation defects (e.g., feature distortion and/or feature shearing). In theory, the intensity and subsequent deleterious effects of such pressure wave oscillations can be ameliorated to some extent by slowing down the rate of pressure change, but such an approach would come at the cost of drastically reduced throughput rate. Further, while the above concerns have been expressed with reference to template 18 and cavity 83, it is to be understood that similar concerns and disadvantages of pressure wave oscillations also apply, e.g., when adjusting pressures in zones 202, 204, and 206 of substrate chuck 14.

Figure 6:
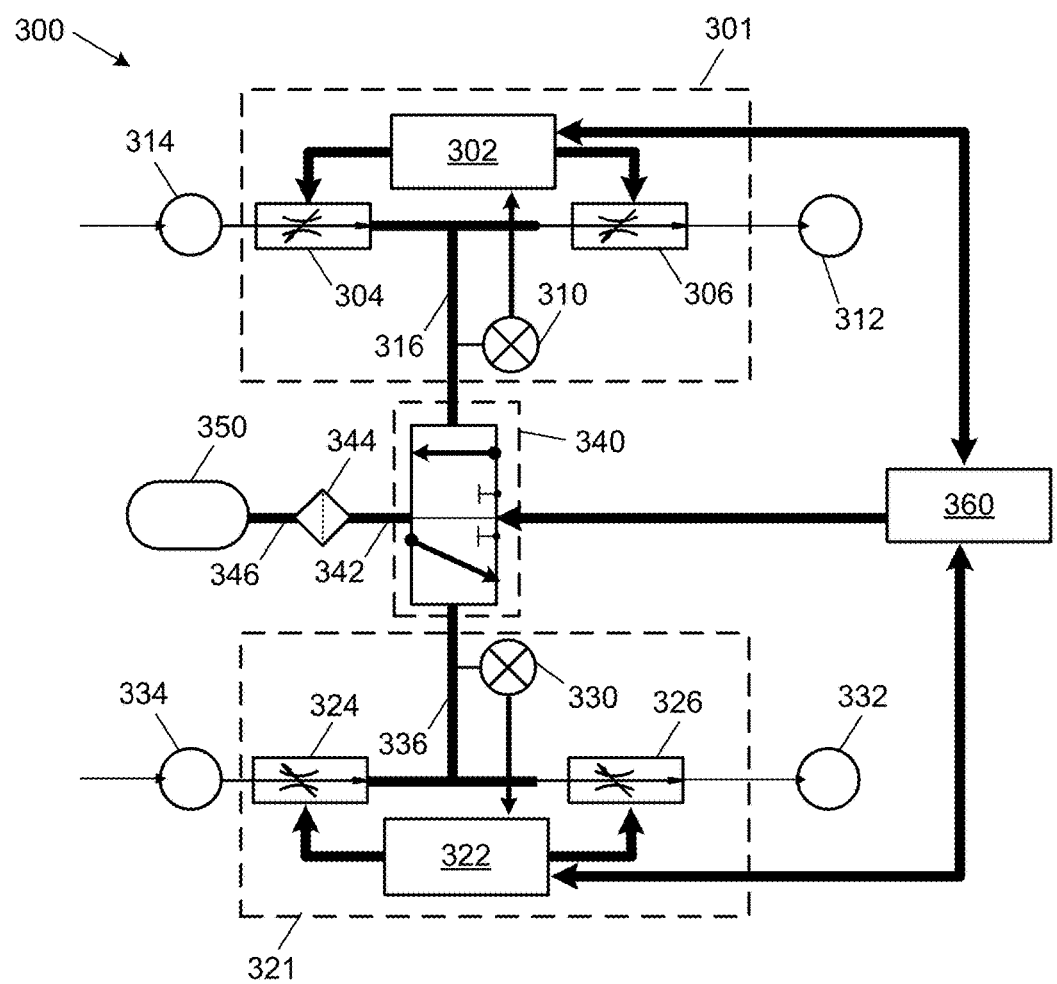
FIG. 6 illustrates a schematic view of an air cavity pressure control system.

FIG. 6 illustrates a pressure control system 300 for controlling pressure to air cavity 350. The system includes a conventional pressure regulator 301 and conventional vacuum regulator 321 for controlling the amount of pressurized air delivered or amount of vacuum applied to air cavity 350. Pressure regulator 301 includes pressure controller 302. Pressure valve 304, under the control of pressure controller 302, connects to pressurized gas supply source 314 and supplies pressurized gas from pressurized source 314 to air cavity 350 through connecting tubing 316, switch valve 340, connecting tubing 342, air filter 344 and tubing 346, as shown. To depressurize the air cavity 350, pressure valve 304 is closed and vent valve 306 is opened to vent air cavity to atmosphere 312. Similarly, vacuum regulator 321 includes vacuum controller 322. Vacuum valve 324, under the control of vacuum controller 342, connects to vacuum source 334 to apply vacuum to air cavity 350 through connecting tubing 336, switch valve 340, and connecting tubing 342, air filter 344 and tubing 346, as shown. To re-pressurize the air cavity 350 to atmospheric pressure, the vacuum valve 324 is closed and vent valve 326 is opened to vent air into cavity 350 from atmosphere 332. Switch valve 340 is a toggle switch for switching between pressure and vacuum conditions. Switch controller 360 controls switch valve 340 in response to input from pressure controller 302 and vacuum controller 322. In line pressure sensors 310 and 330 provide pressure feedback to controllers 302 and 322 respectively. System 300 suffers from at least the following three drawbacks. First, the transition time between pressure states in air cavity 350 is limited by the air flow rate between the pressure source 314 (or vacuum source 334) and the air cavity 350. This flow rate is proportional to the pressure difference between the pressure source 314 or atmosphere 312 (or between vacuum source 334 or atmosphere 332) and the air cavity 350. In many cases this pressure difference is insufficient to establish high flow rates needed for high throughput rates. Second, the mechanical toggling of switch valve 340 back and forth between pressure and vacuum in an effort to maintain at or near zero pressure conditions makes it difficult to maintain a smooth steady state under such conditions. Third, the in-line pressure sensors 310 and 330 are not configured to provide an accurate enough reading of air cavity pressure for high accuracy control purposes, both due to their physical displacement from the air cavity 350 and due to their susceptibility to variations in pressure readings to turbulent flow in lines 316 and 336.

Figure 7:
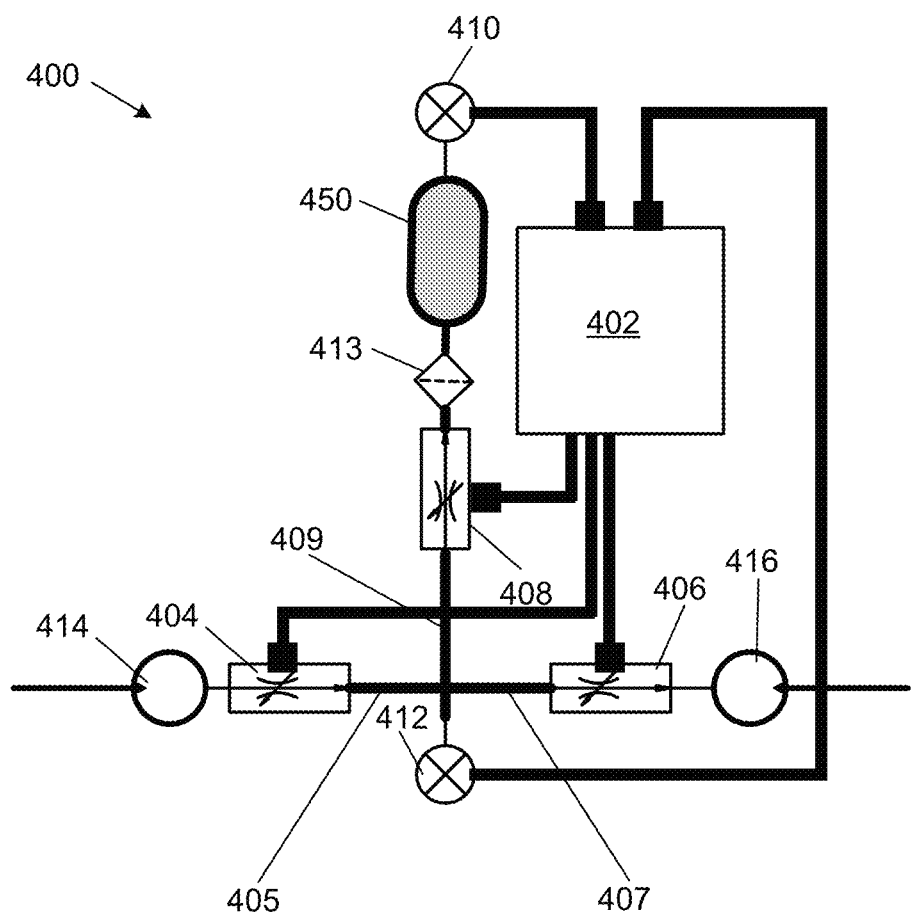
FIG. 7 illustrates a schematic view of an air cavity pressure control system according to an embodiment of the invention.

FIG. 7 illustrates an embodiment of the invention which provides for a system and method for accurately controlling pressure within the cavity with reduced pressure wave oscillations, particularly when transitioning between steady states under high throughput conditions. Such system and method thus provides for high throughput while minimizing overlay error and separation defects. More particularly, system 400 is configured to control pressure within air cavity 450, which is shown here as representative of e.g. inner cavity 83 defined by the template 18 and template chuck 28 assembly shown in FIG. 3, or of zones 202, 204 or 206 of the substrate 12 and substrate chuck 14 assembly shown in FIG. 5. System 400 includes controller 402 which is configured to control pressure valve 404, vacuum valve 406 and impedance valve 408. In certain embodiments, pressure valve 404, vacuum valve 406 and/or impedance valve 408 are high flow rate, fast response servo valves. As further explained herein, impedance valve 408 is used to dynamically match pneumatic impedance to avoid pressure oscillation within cavity 450 during controlled transition between steady pressure states. Such transition control can use feedforward and/or feedback control. Pressure valve 404 connected to pressurized gas supply source 414 and supplies pressurized gas from source 414 to air cavity 450 through connecting tubing 405 and 409, impedance valve 408, and air filter 413 as shown. In an embodiment, the pressurized gas supply source 414 supplies clean dry air (CDA) to cavity 450. Vacuum valve 406 is connected to vacuum supply source 416 and applies vacuum to cavity 450 through connecting tubing 407 and 409, impedance valve 408, and filter 413 as shown. Valves 404 and 406 are further configured in a symmetrical arrangement to minimize turbulent flow. In operation, gas supply 414 and vacuum supply 416, as controlled by valves 404 and 406 respectively, can create a high pressure differential (either positive pressure or vacuum) in a push/pull mode to provide for rapid pressure adjustment to meet high speed operational requirements. Air cavity pressure sensor 410 is positioned at the dead end of air cavity 450 and provides input to controller 402. Valve pressure sensor 412 is positioned at the intersection of connecting tubing 405, 407 and 409 in fluid communication with air cavity 450 and likewise provides input to controller 402. In an embodiment, air cavity sensor 410 or valve sensor 412 or both are dead end sensors. Sensors 410 and 412 are used to measure pressure at the cavity 450 and at valves 404 and 406 and provide associated input to controller 402. From such input, the controller 402 calculates flow rate, resistance, and leakage, and then applies a pressure control law based on such inputs and calculations to increase pressure control accuracy, minimize transition time from one steady state to another, and smooth such transition between states, as compared to system 300.

As further detailed herein, system 400 and related methods of use achieves the following advantages over prior systems and/or methods: (1) increases pressure control accuracy within the cavity at steady state pressure, (2) minimizes the transition time from one steady state to another, and (3) smooths the transition from feed forward (FF) to feedback (FB) control. (As used herein, the term "feedback control" refers to a control method in which a feedback signal and a reference input are compared in order to control the output, so as to maintain operation within specified parameters, and the term "feedforward control" refers to a control method in which the control signal is based on a plant or system model and is applied before the output of a process. For system 400, feedforward control is based on e.g. the air cavity volume, tubing length, and flow rate of servo valves, etc.) The above advantages in turn meet important imprint lithography requirements, including the following. First, the system allows for nm level overlay control accuracy during fluid filling and alignment. That is, overlay accuracy, also referred to as image placement error, is directly related to pressure/vacuum control accuracy. In certain applications, ±0.04 kPa pressure control accuracy is needed to achieve 6 nm overlay (i.e., image placement error ≤6 nm). The system provides for such pressure control accuracy. Second, during, for example, the fluid fill and alignment step, the system allows for rapid reduction of cavity pressure from e.g., 25 kPa to steady state value (±1 kPa) in less than 0.1 s. This maximizes available time for dynamic fluid spread and in-liquid alignment while still meeting total high throughput time budget requirements. Third, during, for example, the separation step, the system allows for further rapid ramp down of cavity pressure from e.g., 0 to a set point value of −30 kPa) in 0.1 s. An analogous system (not shown) is likewise able to ramp up wafer chuck vacuum pressure from e.g. −70 kPa to 20 kPa in 0.1 s.

Figure 8:
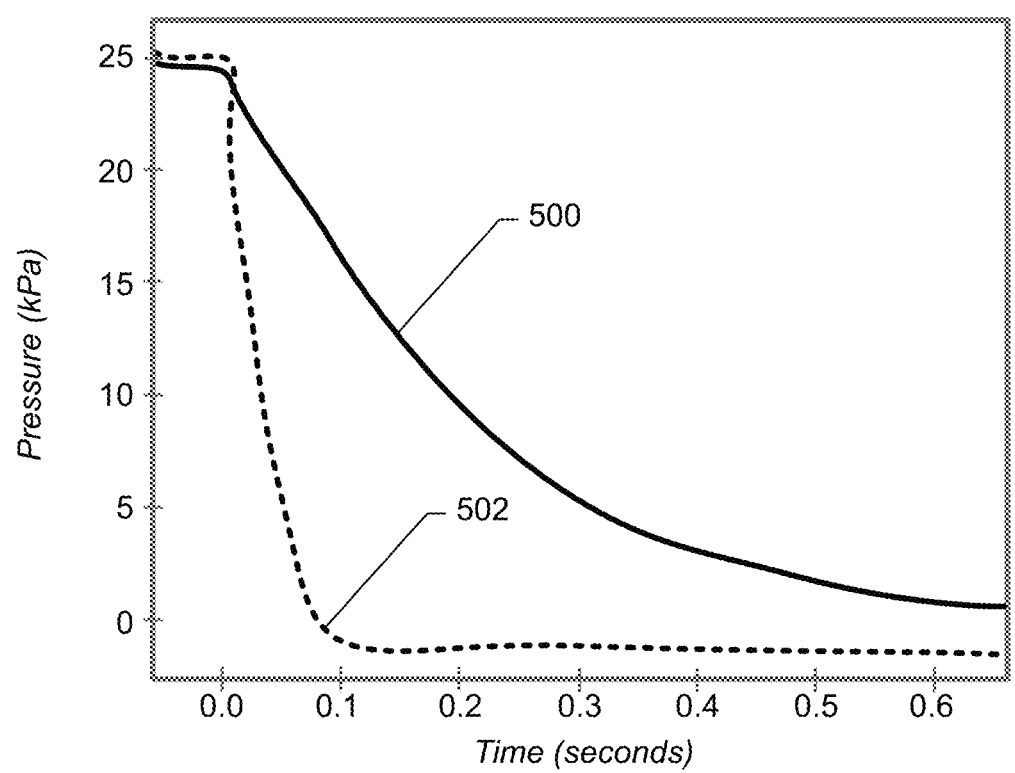
FIG. 8 illustrates a graphical representation of air cavity pressure change over time of air cavity pressure control systems according to FIGS. 6 and 7.

FIG. 8 shows air cavity pressure change over time under the pressure system 300 of FIG. 6 and pressure system 400 of FIG. 7. Line 500 represents pressure change for system 300 and Line 502 represents pressure change for system 400. In system 300, standard pressure and/or vacuum regulators with associated sensors are used to control pressure change in the cavity. As previously, noted the provided sensors in the regulators are positioned in line near the pressure valves and the pressure is controlled using a feedback (FB) control scheme. As reflected by line 500, the pressure change follows an asymptotic curve, taking at least 0.6 seconds to reach the 0 kPa target from the initial state of 25 kPa. Thus, this approach has the following deficiencies. First, overall throughput is limited by feedback (FB) control scheme, as such scheme necessarily requires time-dependent steps of obtaining and processing feedback signals. However, even if the a feedforward (FF) scheme were employed, performance would not be improved, as pressure oscillation at the air cavity and pressure valve, caused by pressure wave reflection, would continue significantly beyond 1 second without ever reaching true equilibrium at 0 kPa. Second, control accuracy is affected by sensor location, i.e., in-line sensors that are subjected to turbulence in the air flow path necessarily produce less accurate pressure readings. Third, two separate regulators are needed to control both pressure and vacuum in the air cavity. Finally, there is a long transition time when ramping down pressure to at or near zero due to the limited pressure difference between air cavity and atmospheric environment. By contrast, system 400 as reflected by line 502 shows a rapid yet controlled transition from 25 kPa to 0 kPa in less than 0.1 second.

Figure 9:
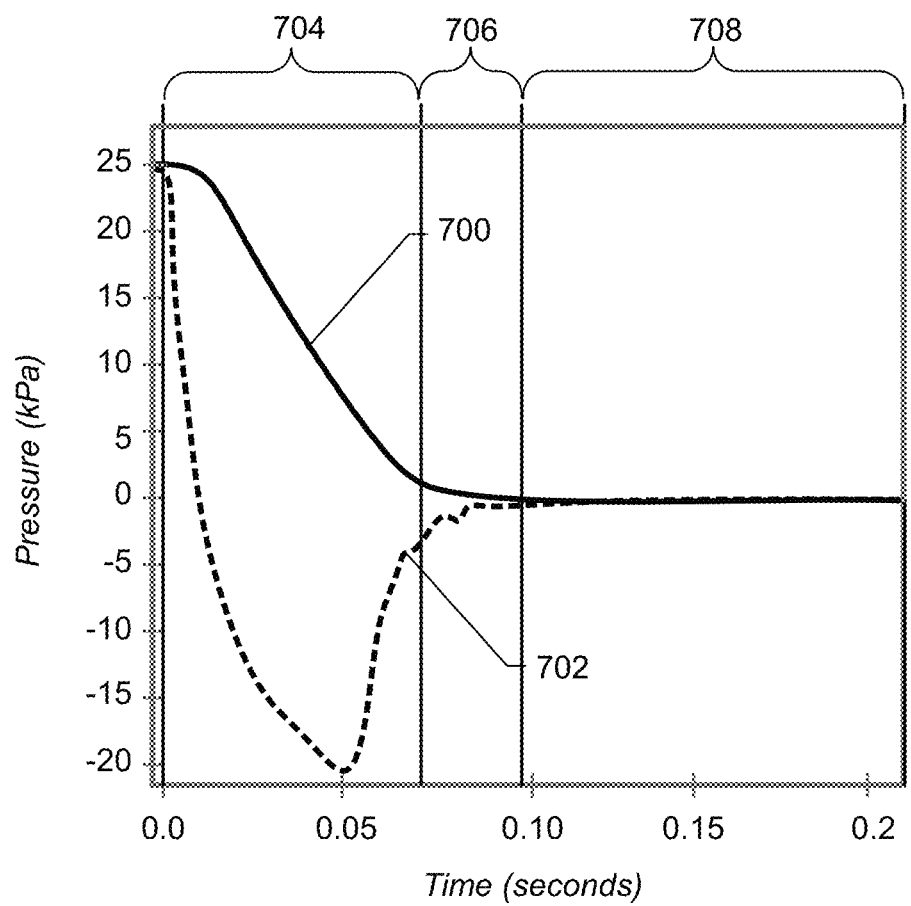
FIG. 9 illustrates a graphical representation of valve and air cavity pressure variations over time of an air cavity pressure control system according to FIG. 7.

Turning to FIG. 9, both air cavity pressure and valve pressure of system 400 are depicted as the pressure is reduced from 25 kPa to 0 kPA. Line 700 represents the air cavity pressure and line 702 represents valve pressure. Here equilibrium is smoothly and rapidly achieved in about 0.1 seconds. This is aided by feedforward (FF) control in the first transition state indicated by section 704. The feedforward control (FF) scheme is designed to minimize the steady state to steady state transition time to the limitations of the physical hardware itself, e.g., gas supply pressure, air cavity volume, resistance caused by tubing and fittings to connect servo valve and air cavity, and the like. Here, impedance valve 408 and one of pressure valve 404 or vacuum valve 406 is fully open with the other remaining valve fully closed, depending on whether increasing or decreasing pressure is being applied to air cavity 450. The fully open time is calculated by a feedforward (FF) coefficient multiplied by changed pressure difference. The fully open time is a function of the volume of air cavity 450, the pressure difference between current valve and set point valve, the supply source pressure (vacuum or pressure) and the impendence between the source (vacuum or pressure) and the air cavity which is determined by tubing length, tubing, connector and fitting internal diameter (ID). The transition time can be minimized by increasing the pressure/vacuum source pressure and/or reducing the air cavity volume and impendence of the system.

In the transition state, designated 706, the pressure control quickly and smoothly transitions from a feedforward (FF) to a feedback (FB) scheme. Here, pressure valve 404 or vacuum valve 406 smoothly transitions from fully open to a steady state valve as the control law transitions from feedforward (FF) to feedback (FB). Here the concern is pressure oscillation at valve 404 or 406 and air cavity 450 caused by pneumatic impedance mismatch when quickly changing the valve from fully open (under FF control) to steady state value (under FB control). Therefore, control of impedance valve 108 by controller 402 is activated to actively control the impedance to match the source and load impedance and to reduce pressure oscillation as pressure control transitions between the FF and FB states. Inputs from both valve sensor 412 and air cavity sensor 410 are used by controller 402 to estimate flow rate and the control law is designed to control flow rate to smoothly reduce pressure to the steady state in one direction and to control pressure in order to reach the steady state value without pressure oscillation, or at the least with reduced pressure oscillation (e.g., oscillations having an amplitude of 0.04 kPa or less, or 0.01 kPa or less, or 0.001 kPa or less).

In the steady state, designated 708, the control accuracy is controlled by a feedback (FB) scheme and is mainly limited by measurement accuracy of pressure sensor and servo valve flow rate control resolution. The feedback control law is designed to control servo valve flow rate to balance the leakage rate of system. Both air cavity sensor 410 and valve pressure sensor 412 are used as the input of the feedback controller to estimate leakage rate and servo valve flow rate. Air cavity 450 (and similarly each individual wafer chuck zone on the wafer side) can be modeled as sealed cavity with minimum leakage. The volume of air cavity 450 can be modeled as a constant. So in steady state, the pressure in cavity 450 mainly depends upon the number of gas molecules in the air cavity as based on the ideal gas law, which in turn depends the leakage rate and controlled flow rate from servo valve. The impedance between output of servo valve and input of air cavity is adjusted to increase control resolution for given servo valve. So the control accuracy is only limited by sensor accuracy and servo valve control resolution. The dead end sensors at both the valves and air cavity provide for more accurate pressure signals by avoiding turbulence associated with the air flow path. The flow rate control resolution of the servo valve is limited by non-linear behavior such as dead zone, hysteresis of servo valve which directly affect control accuracy. This flow rate control resolution is improved by using both vacuum and pressure valve operating at the range of servo valve outside of the dead zone in order to dynamically balance the flow rate of air flowing into the air cavity, based on the flow rate as measured by the valve and air cavity sensor, in order to achieve high control accuracy. For example, when regulating pressure at steady state, the vacuum valve is opened to a value to extract air or gas molecules at a specified rate while the pressure valve is opened at a value to replenish the air or gas molecules at an equivalent rate, such that air cavity pressure remains dynamically balanced. This dynamic balancing approach is capable of achieving pressure control accuracy of at least 0.04 kPa or at least 0.01 kPa or at least 0.001 kPa or better.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprint lithography system comprising:
   a chuck configured to retain an imprint lithography template or substrate such that an air cavity is defined between the retained template or substrate and the chuck;
   a pressurized gas supply source and an associated pressure valve in fluid communication with the air cavity for supplying pressurized gas to the air cavity;
   a vacuum supply source and an associated vacuum valve in fluid communication with the air cavity for applying vacuum to the air cavity;
   an impedance valve located between the air cavity and the pressurized gas supply and vacuum supply sources and in fluid communication with each of the air cavity, the pressurized gas supply source, and the vacuum supply source that modulates an amount of gas pressure or vacuum supplied or applied to the air cavity from the pressurized gas supply source or vacuum supply source, respectively;
   an air cavity sensor for sensing the amount of pressure or vacuum in the air cavity and providing an air cavity sensor input corresponding thereto;
   a valve sensor for sensing an amount of pressure or vacuum at the pressure valve or vacuum valve location and providing a valve sensor input corresponding thereto; and
   a controller that controls the pressure valve and the vacuum valve and that receives the air cavity and valve sensor inputs and based thereon provides an output to the impedance valve, wherein providing the output the impedance valve increases or decreases the amount of gas pressure supplied or vacuum applied to the air cavity such that the gas pressure or vacuum pressure in the cavity is modulated to reduce pressure wave oscillations within the air cavity, and
   wherein the controller is further configured to alter the air cavity pressure from a first steady state to a second steady state and maintain the first steady state or second steady state or both by simultaneously supplying and dynamically balancing both pressure and vacuum to the air cavity through the impedance valve.

2. The imprint lithography system of claim 1 wherein the air cavity sensor or the valve sensor or both are dead end sensors.

3. The imprint lithography system of claim 1 wherein the chuck is configured to retain an imprint lithography template.

4. The imprint lithography system of claim 1 wherein the chuck is configured to retain an imprint lithography substrate.

5. The imprint lithography system of claim 1 wherein a relative pressure difference between the first and second steady states is 25 kPa or more.

6. The imprint lithography system of claim 5 wherein the controller is further configured to alter the air cavity pressure from the first steady state to the second steady state in less than 0.1 seconds.

7. The imprint lithography system of claim 1 wherein the first steady state or second steady state or both are controlled to within at least 0.04 kPa control accuracy.

8. A method of manufacturing a device comprising:
   forming a patterned layer on a substrate using a system according to claim 1;
   transferring a pattern of the patterned layer into the substrate; and
   processing the substrate to manufacture the device.

* * * * *